(12) United States Patent
Hussain et al.

(10) Patent No.: US 9,190,534 B1
(45) Date of Patent: Nov. 17, 2015

(54) ENHANCEMENT MODE NORMALLY-OFF GALLIUM NITRIDE HETEROSTRUCTURE FIELD EFFECT TRANSISTOR

(71) Applicant: HRL Laboratories, LLC, Malibu, CA (US)

(72) Inventors: Tahir Hussain, Calabasas, CA (US); Miroslav Micovic, Thousand Oaks, CA (US); Wah S. Wong, Montebello, CA (US); Shawn D. Burnham, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/248,695

(22) Filed: Apr. 9, 2014

Related U.S. Application Data

(62) Division of application No. 12/510,687, filed on Jul. 28, 2009, now Pat. No. 8,728,884.

(51) Int. Cl.
  *H01L 21/338* (2006.01)
  *H01L 29/80* (2006.01)
  *H01L 29/20* (2006.01)
  *H01L 29/205* (2006.01)

(52) U.S. Cl.
  CPC .......... *H01L 29/802* (2013.01); *H01L 29/2003* (2013.01); *H01L 29/205* (2013.01)

(58) Field of Classification Search
  CPC .................. H01L 29/66462; H01L 29/7787; H01L 29/802; H01L 29/2003; H01L 29/205
  USPC .......... 257/194, 196, 200, E21.346, E21.403, 257/E29.248, E29.247, E29.252, E29.253
  See application file for complete search history.

(56) References Cited

U.S. PATENT DOCUMENTS

| | | | |
|---|---|---|---|
| 5,223,724 A * | 6/1993 | Green, Jr. | 257/194 |
| 5,448,086 A | 9/1995 | Hida | |
| 5,500,381 A * | 3/1996 | Yoshida et al. | 438/172 |
| 5,548,129 A * | 8/1996 | Kubena | 257/24 |
| 5,905,277 A * | 5/1999 | Ota et al. | 257/192 |
| 5,918,130 A | 6/1999 | Hause et al. | |
| 6,013,543 A * | 1/2000 | Manning et al. | 438/163 |
| 6,236,070 B1 * | 5/2001 | Griffin et al. | 257/192 |
| 6,281,528 B1 | 8/2001 | Wada | |
| 6,410,947 B1 | 6/2002 | Wada | |
| 6,884,704 B2 | 4/2005 | Hussain et al. | |

(Continued)

OTHER PUBLICATIONS

Nariaki Ikeda et al., "Normally-Off Operation GaN HEFT Using a Thin AlGaN Layer for Low Loss Switching Devices," Materials Research Society: The Materials Gateway, Warrendale, PA, Paper #: E6.5, Fall 2004, Symposium E.

(Continued)

*Primary Examiner* — Yosef Gebreyesus
(74) *Attorney, Agent, or Firm* — Ladas & Parry

(57) ABSTRACT

A method of fabricating a normally "off" GaN heterostructure field effect transistor having a source and a drain including depositing a passivation layer patterned to cover a channel region between a source and a drain, forming a first opening in the passivation layer, the first opening for defining a gate area in the channel region and the first opening having a first length dimension along a direction of current flow between the source and the drain, and implanting ions in an implant area within the gate area, wherein the implant area has a second length dimension along the direction of current flow shorter than the first length dimension.

12 Claims, 3 Drawing Sheets

(56) References Cited

U.S. PATENT DOCUMENTS

| | | |
|---|---|---|
| 7,180,103 B2 * | 2/2007 | Bude et al. ............... 257/200 |
| 7,648,867 B2 | 1/2010 | Watanabe et al. |
| 7,871,490 B2 | 1/2011 | Kim et al. |
| 8,076,699 B2 | 12/2011 | Chen et al. |
| 8,114,717 B2 | 2/2012 | Palacios et al. |
| 8,124,505 B1 | 2/2012 | Burnham et al. |
| 8,728,884 B1 | 5/2014 | Hussain et al. |
| 2002/0093052 A1 * | 7/2002 | Masuda ............... 257/347 |
| 2005/0179054 A1 | 8/2005 | Toyama |
| 2005/0212049 A1 | 9/2005 | Onodera |
| 2006/0060871 A1 * | 3/2006 | Beach .................. 257/94 |
| 2006/0125041 A1 * | 6/2006 | Yang et al. ............ 257/476 |
| 2006/0244079 A1 * | 11/2006 | Wang et al. ............ 257/407 |
| 2007/0023836 A1 * | 2/2007 | Miura ................... 257/347 |
| 2007/0114569 A1 | 5/2007 | Wu et al. |
| 2007/0278518 A1 | 12/2007 | Chen et al. |
| 2007/0295993 A1 | 12/2007 | Chen et al. |
| 2008/0308813 A1 | 12/2008 | Suh et al. |
| 2009/0032820 A1 | 2/2009 | Chen |
| 2009/0072269 A1 | 3/2009 | Suh et al. |
| 2009/0206375 A1 * | 8/2009 | Saha et al. ............ 257/281 |
| 2010/0025730 A1 | 2/2010 | Heikman et al. |

OTHER PUBLICATIONS

Norio Tsuyukucji et al., "Normally Off-Mode AlGaN/Gan HFET With P-Type Gate Contact," Materials Research Society: The Materials Gateway, Warrendale, PA, Paper #: 0892-FF15-03, Fall 2005, Symposium FF.

Fumio Hasegawa et al., "Proposal and Stimulated Results of a Normally Off AlGaN/GaN HFET Structure With a Charged Floating Gate," Physica Status Solidi ©, Wiley InterScience, Weinheim, Jan. 14, 2009. pp. S940-S943.

Ikeda Nariaki et al., "Normally-Off Operation Power AlGaN/GaN HFET," Papers of Technical Meeting on Electron Devices, IEEE Japan, vol. EDD-04, No. 66-73, pp. 11-15, (2004).

From U.S. Appl. No. 12/510,687 (now U.S. Pat. No. 8,728,884), Application and Office Actions, including but not limited to the Office Actions mailed on Dec. 13, 2011, Mar. 13, 2012, Sep. 5, 2012, Mar. 5, 2013, and Jan. 10, 2014.

* cited by examiner

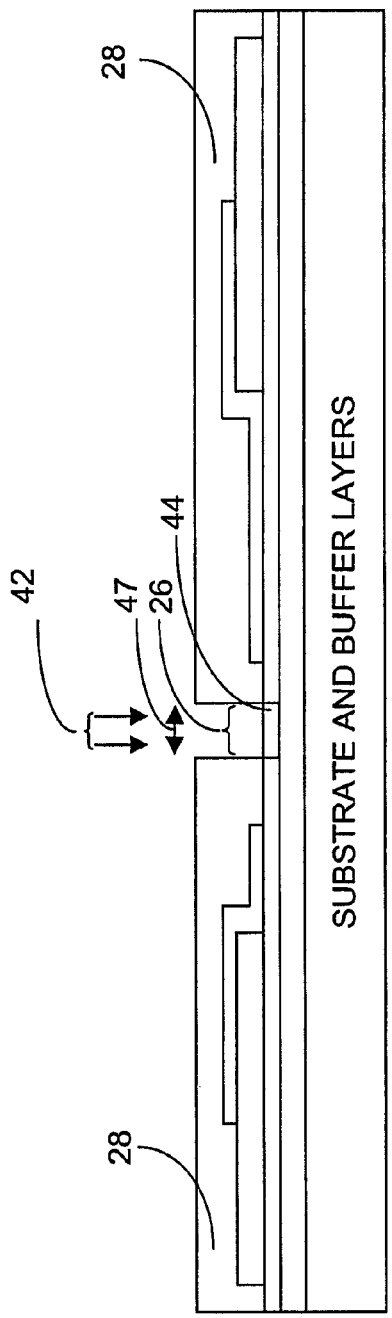
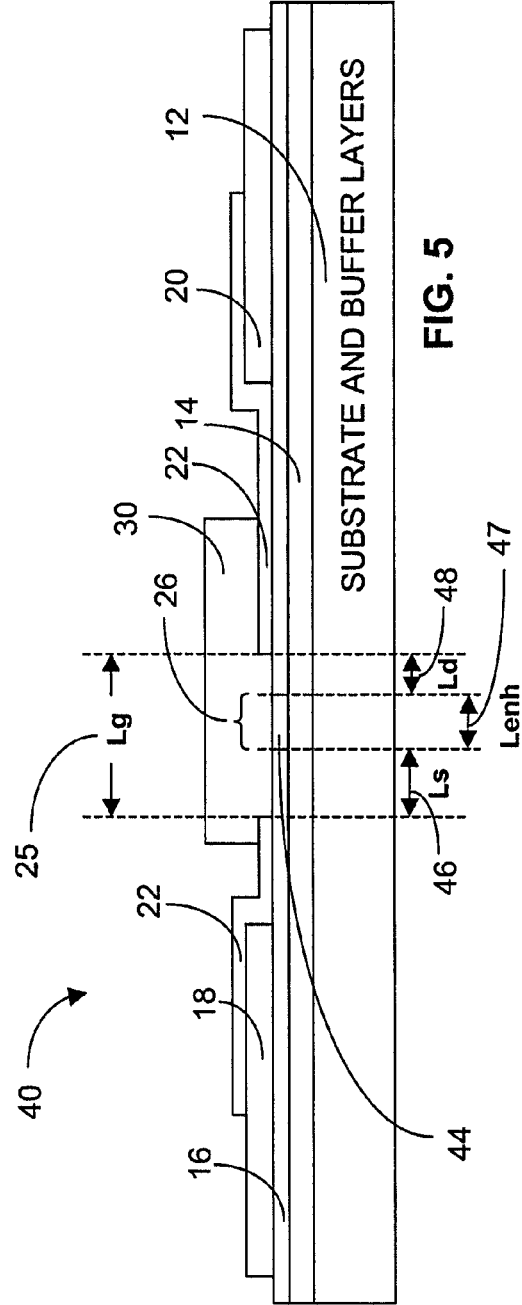

| DEPOSITING A PASSIVATION LAYER PATTERNED TO COVER A CHANNEL REGION BETWEEN A SOURCE AND A DRAIN | 200 |

| FORMING A FIRST OPENING IN THE PASSIVATION LAYER, THE FIRST OPENING FORMING A GATE AREA IN THE CHANNEL REGION AND THE FIRST OPENING HAVING A FIRST LENGTH DIMENSION ALONG A DIRECTION OF CURRENT FLOW BETWEEN THE SOURCE AND THE DRAIN | 202 |

| FORMING A PATTERN FOR A SECOND OPENING WITHIN THE GATE AREA, THE SECOND OPENING HAVING A SECOND LENGTH DIMENSION ALONG THE DIRECTION OF CURRENT FLOW SHORTER THAN THE FIRST LENGTH DIMENSION AND A RELATIVE POSITION WITHIN THE GATE AREA OFFSET TOWARDS THE DRAIN | 204 |

| IMPLANTING IONS THROUGH THE SECOND OPENING INTO AN IMPLANT AREA DEFINED BY THE SECOND OPENING WITHIN THE GATE AREA VIA A FLUORINE ION TREATMENT USING AN INDUCTIVELY COUPLED PLASMA TOOL | 206 |

| REMOVING THE PATTERN FOR THE SECOND OPENING WITHIN THE GATE AREA AND DEPOSITING GATE CONTACT METAL OVER THE GATE AREA | 208 |

FIG. 6

ENHANCEMENT MODE NORMALLY-OFF GALLIUM NITRIDE HETEROSTRUCTURE FIELD EFFECT TRANSISTOR

CROSS REFERENCE TO RELATED APPLICATION

This is a divisional application of U.S. patent application Ser. No. 12/510,687, filed on Jul. 28, 2009, which is incorporated herein as though set forth in full.

FIELD

This disclosure relates to gallium nitride heterostructure field effect transistors (GaN HFETs), and more particularly to normally off GaN HFETs.

BACKGROUND

GaN HFETs are very promising solid state devices for use in power switching applications. Some notable power switching applications include hybrid and fuel-cell vehicles. For these applications and others high efficiency and fast switching is needed. Also needed is a light-weight power system with low power loss and therefore relatively lower heat dissipation, so that the power system allows a vehicle to carry larger payloads and/or have a longer range.

Typically GaN HFETs are made in a depletion-mode or "normally-on" configuration. For safety reasons, some system designs call for "normally-off" power switches. In this discussion, "normally on" means that the transistor can conduct current without a voltage applied to the gate of the field effect transistor. "Normally off" means that the transistor cannot conduct current unless a voltage is applied to the gate.

There are "normally-off" GaN HFETs in the prior art; however, these prior art GaN HFETs are not power efficient. In the prior art, "normally-off" operation has been achieved by shifting the threshold voltage of the device to a positive value, which requires that a voltage be applied to the gate of the transistor in order to put the transistor into an "ON" state. Methods known in the art rely on converting the material under the entire gate length of the transistor so that the threshold voltage of the device is shifted to a positive value. However, these known methods result in a device that has an undesirable high electrical resistance in the "ON" state, which results in a relatively high power loss and heat dissipation in the device. Using such inefficient devices, for example, in hybrid vehicles may limit the operating range of the vehicles, which is a severe drawback.

What is needed is a highly efficient GaN HFET that is "normally-off". Also needed is a fast switching GaN HFET that has low power loss when in the "ON" state. The embodiments of the present disclosure answer these and other needs.

SUMMARY

In a first embodiment disclosed herein, a method of fabricating a normally "off" GaN heterostructure field effect transistor having a source and a drain includes depositing a passivation layer patterned to cover a channel region between a source and a drain, forming a first opening in the passivation layer, the first opening for defining a gate area in the channel region and the first opening having a first length dimension along a direction of current flow between the source and the drain, and implanting ions in an implant area within the gate area, wherein the implant area has a second length dimension along the direction of current flow shorter than the first length dimension.

In another embodiment disclosed herein, a method of fabricating a normally "off" GaN heterostructure field effect transistor having a source and a drain includes depositing a passivation layer patterned to cover a channel region between a source and a drain, forming a first opening in the passivation layer, the first opening for defining a gate area in the channel region and the first opening having a first length dimension along a direction of current flow between the source and the drain, forming a pattern for a second opening within the gate area, the second opening having a second length dimension along the direction of current flow shorter than the first length dimension, and implanting ions through the second opening into an implant area defined by the second opening within the gate area.

In yet another embodiment disclosed herein, a normally "off" GaN heterostructure field effect transistor having a source and a drain includes a gate area in a channel region between the source and the drain, the gate area having a first length dimension along a direction of current flow between the source and the drain, and ions implanted in an implant area within the gate area, wherein the implant area has a second length dimension along the direction of current flow shorter than the first length dimension.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 4 shows another partially fabricated GaN HFET in accordance with the present disclosure;

FIG. 5 shows a GaN HFET in accordance with the present disclosure; and

FIG. 6 is a flow chart illustrating a method of fabricating a GaN HFET in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
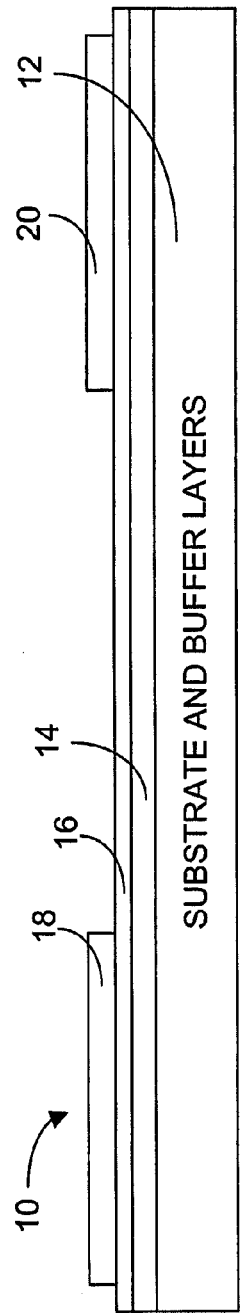
FIG. 1 shows a partially fabricated GaN HFET in accordance with the present disclosure.

Referring to FIG. 1, a partially fabricated GaN HFET 10 in accordance with the present disclosure is shown. The GaN HFET 10 has substrate and buffer layers 12. The substrate may be formed of silicon (Si), silicon carbide (SiC) or gallium nitride (GaN). The purpose and fabrication of the buffer layers are well known in the art and provide for a more defect free channel region. The channel region is between the source contact 18 and the drain contact 20 and may include channel layer 14, which may be formed of undoped GaN material, and an AlGaN Schottky layer 16 over the channel layer 14, which is well known in the art to provide charge for conduction in the channel layer 14. The source contact 18 is deposited near one end of the GaN HFET 10 and the drain contact 20 is deposited near another end of the GaN HFET 10. The source contact 18 and the drain contact 20 may include titanium (Ti), aluminum (Al), nickel (Ni), platinum (Pt), iridium (Ir) or some combination of these metals and have an overlay of thicker gold (Au) or other metal layer to reduce the contact resistance.

Figure 2:
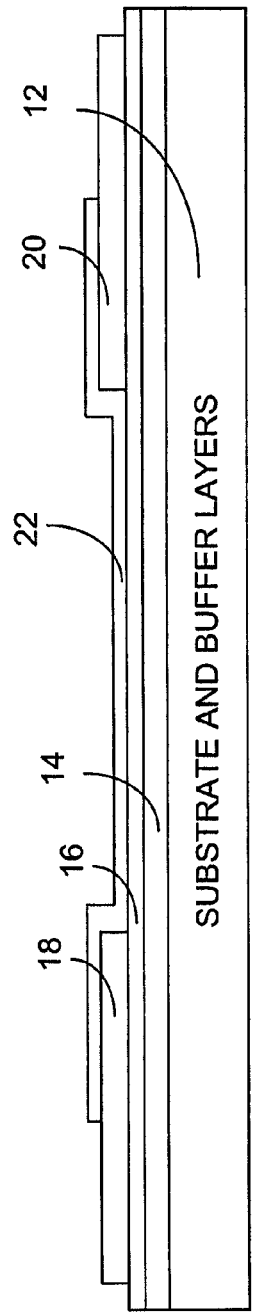
FIG. 2 shows another partially fabricated GaN HFET in accordance with the present disclosure.

FIG. 2 shows another step in the fabrication of the GaN HFET. A passivation layer 22 is deposited to cover the channel region between the source contact 18 and the drain contact 20. The passivation layer 22 may be formed of silicon nitride (SiN), aluminum oxide ($Al_2O_3$), or hafnium oxide ($HfO_2$). Without implying a limitation, in one embodiment a silicon nitride passivation layer may be 200 to 500 angstroms thick.

Figure 3:
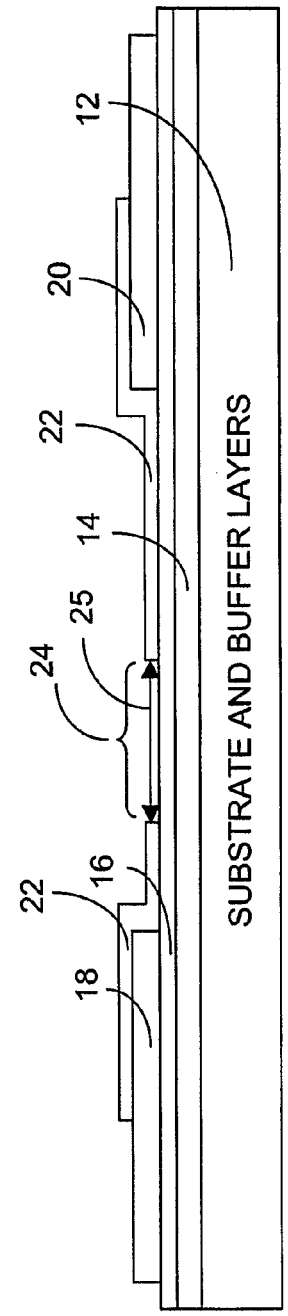
FIG. 3 shows yet another partially fabricated GaN HFET in accordance with the present disclosure.

FIG. 3 shows yet another step in fabricating the GaN HFET. In FIG. 3 a first opening 24 is formed in the passivation layer 22 using photolithography and etching methods or other methods well known in the art. The first opening 24 has the purpose of forming a gate area defined by the first opening 24 in the channel region, which includes channel layer 14 and AlGaN Schottky layer 16, under the first opening 24. The first opening 24 defines a gate length (Lg) 25, as shown in FIG. 3 and in FIG. 5, along the direction of current flow between the source contact 18 and the drain contact 20. The gate length 25 may be 0.25 to 2 microns in length. In a preferred embodiment the gate length 25 is 2 microns in length.

FIG. 4 shows another step in the fabrication of the GaN HFET. A suitable patterning process, using known techniques such as photo lithography or using electron beam lithography, is used to form a pattern 28, which has a second opening 26, which is within the first opening 24. The second opening 26 has a second length dimension (Lenh) 47, as shown in FIG. 3 and in FIG. 5, along the direction of current flow between the source contact 18 and the drain contact 20. The second length dimension 47 is shorter than the gate length 25 and the second opening 26 is offset within gate length 25 to be relatively closer to the drain contact 20 than the source contact 18. As shown in FIG. 5, length (Ls) 46 is longer than length (Ld) 48.

Ions 42 are then implanted through the second opening 26 into the channel region below the second opening. The ions 42 may be of an arbitrary ion-species and can be introduced using any ion-implantation technique. In a preferred embodiment the ions 42 are implanted using a fluorine ion treatment using an inductively coupled plasma tool. Preferably the ions 42 are implanted into region 44 in the AlGaN layer 16. As a result of implanting the ions 42 into region 44 the threshold of the GaN HFET 40, shown in FIG. 5, is shifted to be a positive voltage, which results in a normally "off" GaN heterostructure field effect transistor, because a voltage needs to be applied to gate contact 30, shown in FIG. 5, for current to flow between the source 18 and the drain 20.

By implanting the ions only into the second opening 26, as opposed to the entire first opening 24 as described above for the prior art, electrical resistance in the "ON" state for GaN HFET 40 is low, which results in an efficient device with relatively low power loss and heat dissipation in the device. By offsetting the second opening 26 for the implant of ions toward the drain 20, the electrical field at the drain side edge of the gate area is advantageously lowered.

After implanting the ions 42, the pattern 28 shown in FIG. 4 may be removed using well known methods.

Subsequently gate contact 30 is deposited using patterning and depositing techniques known in the art. The gate contact 30 covers the first opening 24 forming the gate area and may include titanium (Ti), aluminum (Al), nickel (Ni), platinum (Pt), iridium (Ir) or some combination of these metals. The gate contact 30 may also include an overlay of thicker gold (Au) or other metal layer to reduce the resistance of the gate contact.

FIG. 6 is a flow chart illustrating a method of fabricating GaN HFET 40 in accordance with the present disclosure. In step 200 a passivation layer 28 patterned to cover a channel region between source 18 and drain 20 is deposited. Then in step 202 a first opening 24 is formed in the passivation layer 28. The first opening 24 forms a gate area in the channel region and the first opening has a first length dimension 25 along a direction of current flow between the source 18 and the drain 20. Then in step 204 a pattern 28 is formed for a second opening 26 within the gate area. The second opening has a second length dimension 47 along the direction of current flow between the source 18 and drain 20, which is shorter than the first length dimension 25. The relative position of the second opening 26 within the gate area is offset to be closer to the drain 20 than the source 18. Next, in step 206 ions 42 are implanted through the second opening 26 into an implant area defined by the second opening 26 within the gate area. The ions 42 may be implanted using a fluorine ion treatment using an inductively coupled plasma tool. Then in step 208 the pattern 28 for the second opening 26 within the gate area is removed and gate contact 30 is deposited over the gate area.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A normally "off" GaN heterostructure field effect transistor having a source and a drain comprising:
    a gate area in a channel region between the source and the drain, the gate area having a first length dimension along a direction of current flow between the source and the drain; and ions in an implant area within the gate area, wherein the implant area has a second length dimension along the direction of current flow shorter than the first length dimension;

wherein the implant area has a relative position within the gate area offset towards the drain.

2. The normally "off" GaN heterostructure field effect transistor having a source and a drain of claim 1 wherein:
the channel region comprises:
a GaN channel layer; and
an AlGaN Schottky layer over the GaN channel layer; and
the implant region is in the AlGaN Schottky layer.

3. The normally "off" GaN heterostructure field effect transistor of claim 1 wherein the first length dimension is 0.25 to 2 microns in length.

4. The normally "off" GaN heterostructure field effect transistor of claim 1 wherein the ions comprise fluorine ions.

5. The normally "off" GaN heterostructure field effect transistor of claim 1 further comprising:
gate contact metal deposited over the gate area;
wherein the gate contact metal is titanium, aluminum, nickel, platinum, or iridium, or any combination thereof.

6. The normally "off" GaN heterostructure field effect transistor of claim 1 wherein:
the first length dimension of the gate area in the channel region comprises a sum of a third length dimension, a fourth length dimension, and a fifth length dimension along the direction of current flow between the source and the drain;
wherein the third length dimension is near the source;
wherein the fifth length dimension is near the drain;
wherein the fourth length dimension is between the third length dimension and the fifth length dimension;
wherein the third length dimension is greater than the fifth length dimension; and
wherein the implant area is in the fourth length dimension of the gate area in the channel region.

7. A normally "off" GaN heterostructure field effect transistor having a source and a drain comprising:
a substrate;
a buffer layer on the substrate;
a channel layer on the buffer layer;
a charge providing layer on the channel layer;
a gate between the source and the drain, the gate having a first length dimension along a direction of current flow between the source and the drain;
ions in an implant area in the charge providing layer, wherein the implant area is under the gate;
wherein the implant area has a second length dimension along the direction of current flow shorter than the first length dimension; and
wherein the implant area has a relative position under the gate that is offset towards the drain.

8. The normally "off" GaN heterostructure field effect transistor of claim 7 wherein:
the channel comprises GaN; and
the charge providing layer comprises an AlGaN Schottky layer.

9. The normally "off" GaN heterostructure field effect transistor of claim 7 wherein the first length dimension is 0.25 to 2 microns in length.

10. The normally "off" GaN heterostructure field effect transistor of claim 7 wherein the ions comprise fluorine ions.

11. The normally "off" GaN heterostructure field effect transistor of claim 7 wherein the gate comprises titanium, aluminum, nickel, platinum, or iridium, or any combination thereof.

12. The normally "off" GaN heterostructure field effect transistor of claim 7 wherein:
the first length dimension of the gate comprises a sum of a third length dimension, a fourth length dimension, and a fifth length dimension along the direction of current flow between the source and the drain;
wherein the third length dimension is near the source;
wherein the fifth length dimension is near the drain;
wherein the fourth length dimension is between the third length dimension and the fifth length dimension;
wherein the third length dimension is greater than the fifth length dimension; and
wherein the implant area is under the fourth length dimension of the gate.

* * * * *